United States Patent [19]

Babini et al.

[11] 4,310,830
[45] Jan. 12, 1982

[54] METHOD OF AND SYSTEM FOR ANALOG/DIGITAL CONVERSION

[75] Inventors: Giancarlo Babini; Bruno Fabbri, both of Turin; Paolo Lucchini, Udine, all of Italy

[73] Assignee: CSELT - Centro Studi e Laboratori Telecomunicazioni S.p.A., Turin, Italy

[21] Appl. No.: 74,295

[22] Filed: Sep. 11, 1979

[30] Foreign Application Priority Data

Sep. 13, 1978 [IT] Italy .................... 69106 A/78

[51] Int. Cl.³ ............................................ H03K 13/02
[52] U.S. Cl. .................. 340/347 AD; 340/347 M; 375/25
[58] Field of Search ............... 340/347 M, 347 AD; 375/25

[56] References Cited

U.S. PATENT DOCUMENTS 3,736,586  5/1973  Donjon ................ 340/347 AD X

Primary Examiner—Thomas J. Sloyan
Attorney, Agent, or Firm—Karl F. Ross

[57] ABSTRACT

To convert a sample of an amplitude-modulated voltage wave into binary pulses, the sample is simultaneously compared in two coders with two sets of threshold voltages of positive and negative polarity, respectively. Either one of the two coders yields in unbroken succession of pulses, having the same polarity as the sample, whereas the other coder produces a combination of both positive and negative pulses. Following inversion of the pulses issuing from one coder, and upon suppression of the pulses of one polarity (e.g. negative), the two pulse trains are combined into a series of bit groups each representing the absolute amplitude value of a respective sample. The final step in the processing of any sample is the generation of a sign bit in accordance with the polarity of the unipolar pulse train emitted by one of the coders; this sign bit is then transposed to the beginning of the corresponding group of amplitude bits.

6 Claims, 3 Drawing Figures

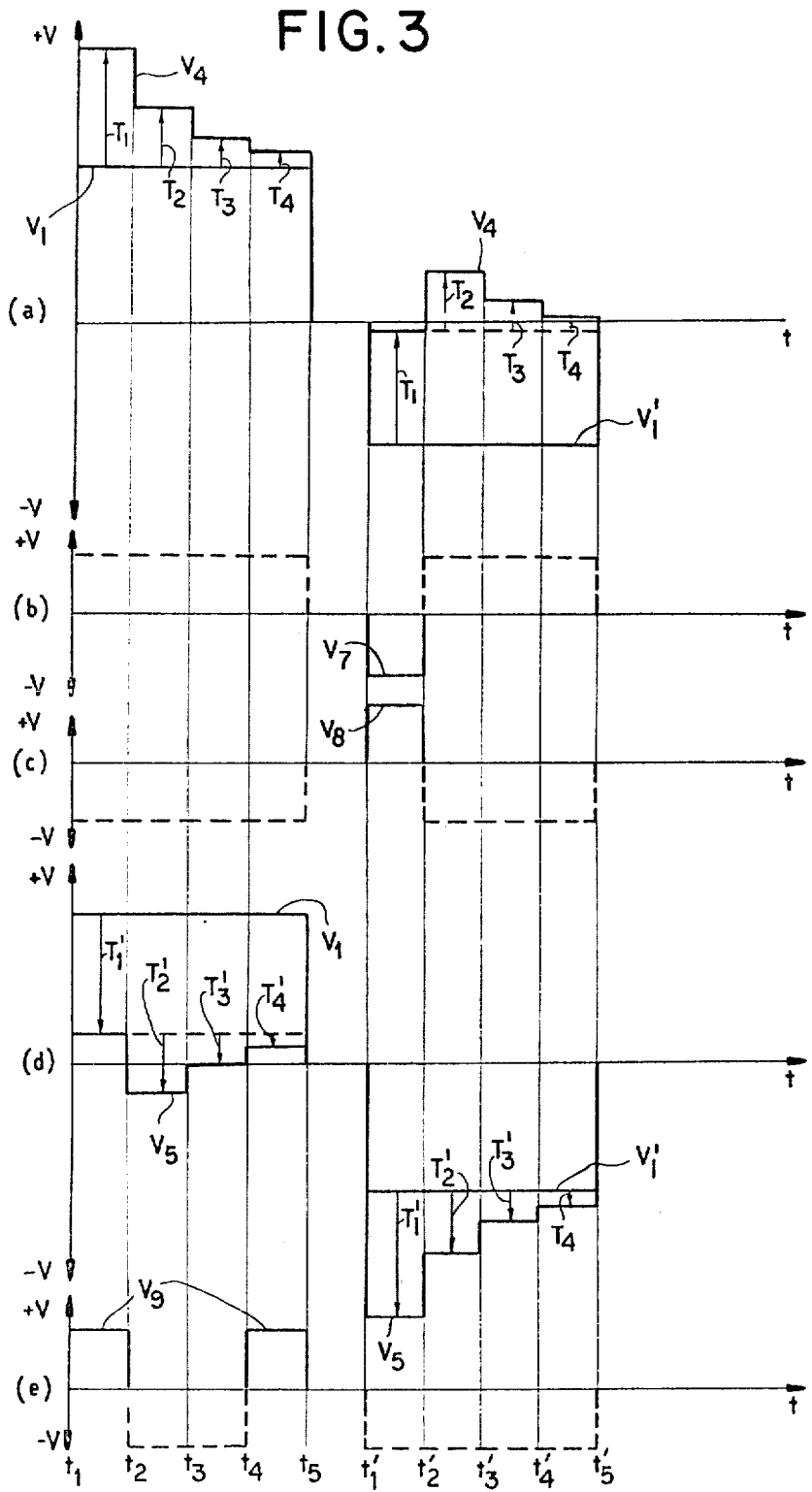

METHOD OF AND SYSTEM FOR ANALOG/DIGITAL CONVERSION

Field of the Invention

Our present invention relates to a method of and a system for converting samples of amplitude-modulated analog signals into their digital equivalent, i.e. into groups of binary pulses.

BACKGROUND OF THE INVENTION

In pulse-code-modulation (PCM) communication, pulse-amplitude-modulated (PAM) samples are taken at regular intervals from analog voltages or currents and are then converted into digital form by successive comparisons with a predetermined number of voltage or current thresholds. The polarity of these thresholds is chosen to conform to that of the PAM sample, which must therefore be initially determined. With the use of n thresholds, the resulting n amplitude bits of progressively decreasing rank are supplemented by a sign bit preceding the highest-ranking amplitude bit of the group. The number n depends, of course, on the desired degree of accuracy of amplitude coding. PCM telephone systems generally employ eight bits per sample, the seven amplitude bits enabling the coding of 128 different levels.

The initial determination of the sign bit, whose logical value represents the polarity of the sample, is carried out immediately after the leading edge of the sampling pulse, thus at a time when the measured amplitude of the analog signal may be significantly affected by transients. With low amplitude levels, therefore, the polarity of the signal may be misread whereby the thresholds chosen for comparison purposes may be of the wrong polarity. If, for example, the sample is a low negative voltage and is differentially combined with a series of positive threshold voltages, the resulting pulses will all be positive as though the signal were of large positive amplitude.

OBJECTS OF THE INVENTION

A major object of our present invention, therefore, is to provide an improved digitization method which obviates this drawback.

An equally important object is to provide a simple analog/digital converter for carrying out this improved method.

SUMMARY OF THE INVENTION

In accordance with our present invention, the determination of the amplitude bits is made independent of the polarity of the PAM sample by simultaneously subjecting each sample to a first series of n consecutive comparisons with a set of binarily weighted thresholds of one polarity in a first coder and to a second series of n consecutive comparisons with a set of similarly weighted thresholds of the opposite polarity in a second coder, with the result that either one of these two coders emits an unbroken succession of n unipolar pulses, whereas the other coder yields—except with zero or peak amplitude levels—a combination of both positive and negative pulses. Pulses obtained from the first coder are inverted by a first comparator in order that the n unipolar pulses, whether issuing from the first or the second coder, will always have the same polarity. Upon the suppression of all the pulses of that polarity (hereinafter assumed to be negative by way of example) in the outputs of the inverting comparator and of a noninverting comparator connected to the second coder, there remains in one of these outputs a group of n amplitude bits representing the absolute magnitude of the PAM sample. From the original polarity of the subsequently suppressed set of unipolar pulses, e.g. as determined from the polarity of the surviving pulses of the other set, we can now determine the polarity of the sample and thus generate the proper sign bit at the end of the digitization process. Since at that time the transients created by the appearance of the sampling pulse have decayed, the sign bit will read correctly even with low signal amplitudes.

Advantageously, pursuant to a more particular feature of our invention, the sign bit so generated is then transferred to a position ahead of the group of n amplitude bits previously formed whereby the resulting word of $(n+1)$ bits conforms to those produced by the conventional method and can be decoded by existing equipment.

BRIEF DESCRIPTION OF THE DRAWING

The above and other features of our invention will now be described in detail with reference to the accompanying drawing in which:

FIG. 3 is a set of graphs relating to the operation of the converter.

SPECIFIC DESCRIPTION

Figure 1:
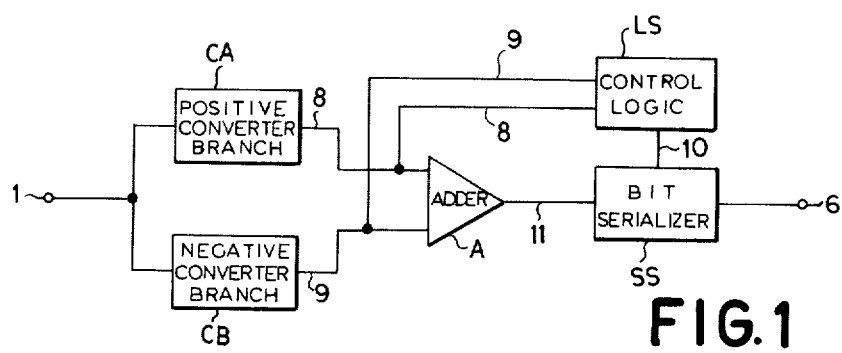
FIG. 1 is a block diagram of an analog/digital converter embodying our invention.

In FIG. 1 we have shown a line 1 carrying samples of analog signals (e.g. voltages) of either polarity to be digitized. These samples are fed in parallel to a positive branch CA and a negative branch CB of a conversion system more fully described hereinafter with reference to FIG. 2. The two branches have output leads 8 and 9 extending to a binary adder A as well as to a logic circuit LS controlling a bit serializer SS via a connection 10. Serializer SS receives from adder A, over an output lead 11, successive groups of n amplitude bits each and combines them with a sign bit, placed at the beginning of the group, which is generated in circuit LS in response to the pulse trains appearing on leads 8 and 9. Store SS has an output lead 6.

Figure 2:
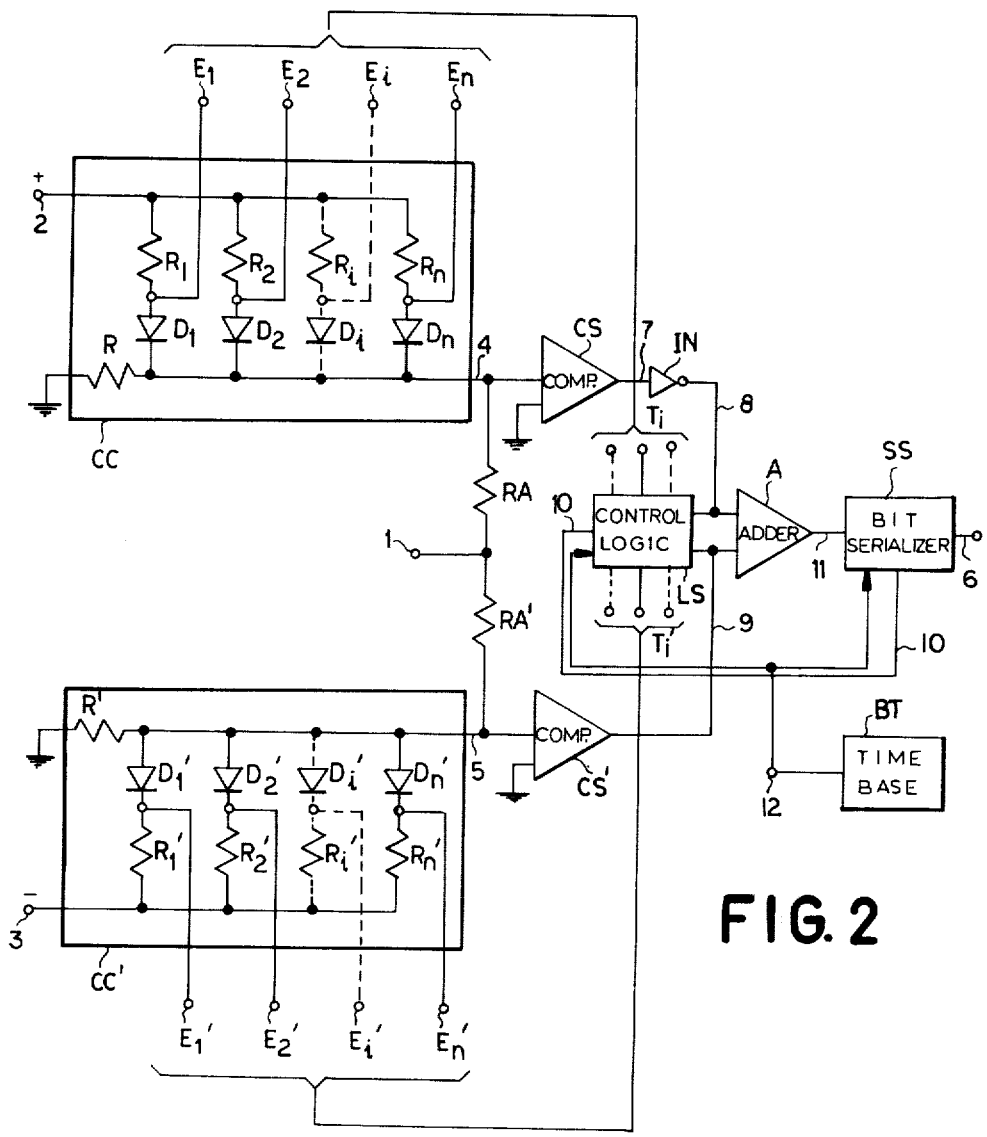
FIG. 2 is a more detailed circuit diagram of such a converter.

As shown in FIG. 2, the analog samples appearing on line 1 are fed through respective resistors RA and RA' to a pair of conductors 4 and 5 which are grounded by way of respective resistors R and R'. The latter are part of a pair of symmetrical coders CC and CC' which together with two comparators CS and CS' constitute the converter branches CA and CB of FIG. 1. The two coders CC and CC' each include n threshold generators connected in parallel between conductor 4 and a positive bus bar 2 in the case of coder CC and between conductor 5 and a negative bus bar 3 in the case of coder CC'. Each threshold generator consists of a resistor $R_1, R_2, \ldots R_i, \ldots R_n$ or $R_1', R_2', \ldots R_i', \ldots R_n'$ in series with a respective diode $D_1, D_2, \ldots D_i, \ldots D_n$ or $D_1', D_2', \ldots D_i', \ldots D_n'$. The junctions of these resistors and diodes are connected to respective biasing leads $E_1, E_2, \ldots E_i, \ldots E_n$ or $E_1', E_2', \ldots E_n'$ whose energization is controlled by the logic circuit LS via output leads of that circuit designated $T_i$ and $T_i'$. As will be apparent, the threshold generators of coder CC are inactive when their diodes are biased negatively whereas those of coder CC' are deactivated by a positive biasing potential. The absolute values of the output voltages of the threshold generators of each coder are decreasing by consecutive powers of 2.

Conductors 4 and 5 respectively extend to the aforementioned comparators CS and CS' also having grounded second inputs. Comparator CS is provided with an inverter IN, shown inserted between the output 7 of that comparator and the lead 8 extending to adder A. Comparator CS' works directly into lead 9. A time base BT controls the operation of logic circuit LS and serializer SS in synchronism with a nonillustrated gating circuit in line 1 periodically supplying an analog pulse to coders CC and CC' in parallel.

When that analog pulse appears, logic circuit LS first activates threshold generators $R_1$, $D_1$ and $R_1'$, $D_1'$ which have the smallest resistance and therefore determine the highest-ranking bits. If the sample is positive and larger than the absolute value of the negative threshold voltage applied via diode $D_1'$ to conductor 5, comparator CS' emits a positive pulse on lead 9. In that instance, threshold generator $R_1'$, $D_1'$ remains active while logic circuit LS turns on the next-ranking generators $R_2$, $D_2$ and $R_2'$, $D_2'$ whose output voltages are only half as high; otherwise, diode $D_1'$ would be cut off. In like manner, the activation of each higher-ranking generator is either maintained or terminated upon the switchover to the next-lower generator. Since coder CC has a positive output in the presence of a positive PAM sample regardless of which of its threshold generators is active, all the diodes $D_1$-$D_n$ conduct at the end of this coding cycle. Thus, comparator CS receives only positive pulses on conductor 4 under these circumstances and feeds them via lead 7 to inverter IN which changes their polarity and suppresses them. Comparator CS', on the other hand, suppresses all negative pulse appearing on conductor 5 and passes the positive ones to lead 9. This lead, accordingly, is the only one carrying pulses in the event of a positive PAM sample.

If the sample is negative, conditions are reversed and comparator CS' suppresses the all-negative pulse series appearing on conductor 5 while comparator CS and inverter IN produce positive pulses on lead 8. From the energization of one or the other of these leads, therefore, logic circuit LS can ascertain the polarity of the sample and can supply a sign bit of corresponding logical value via lead 10 to serializer SS.

The latter, having already received on lead 11 the n amplitude bits summed in adder A, enters the arriving sign bit in a stage of a parallel-input/serial-output register ahead of n other stages occupied by these amplitude bits. Upon subsequent readout via output lead 6, the sign bit appears first and is followed by the amplitude bits of progressively lower rank previously delayed in serializer SS.

If the absolute signal amplitude is less than the lowest threshold level, neither comparator will emit any pulses so that leads 8 and 9 remain both de-energized. Since there are no amplitude bits produced, the value of the sign bit generated in such a case by circuit LS is immaterial.

We shall now further explain the aforedescribed mode of operation of our improved analog/digital converter with reference to FIG. 3 in which graphs (a) and (d) show two signal samples $V_1$ and $V_1'$ of opposite polarities successively appearing on the incoming line 1. For simplicity's sake, the conversion is here assumed to involve only four amplitude bits represented by respective binarily weighted threshold voltages $T_1$-$T_4$ and $T_1'$-$T_4'$ successively applied by coders CC and CC' to conductors 4 and 5, respectively; each of the threshold voltages following voltages $T_1$ and $T_1'$ has half the absolute magnitude of the immediately preceding one.

Upon the appearance of signal sample $V_1$ at an instant $t_1$, threshold generator $R_1$, $D_1$ of coder CC is activated to superimpose its positive voltage $T_1$ upon the signal voltage $V_1$ to produce on conductor 4 a positive voltage $V_4$ as indicated in graph (a) of FIG. 3. At the same time, activation of threshold generator $R_1'$, $D_1'$ subtracts a negative voltage $T_1'$ of the same absolute magnitude from signal $V_1$ whose amplitude happens to exceed that absolute magnitude so that the voltage $V_5$ now present on conductor 5 is of positive polarity. The positive voltage $V_4$ is suppressed by comparator CS and inverter IN as indicated by broken lines in graphs (b) and (c) respectively representing the voltages $V_7$ on lead and $V_8$ on lead 8. The positive voltage $V_5$, on the other hand, clears the comparator CS' so as to appear as a positive pulse $V_9$ on lead 9 as indicated in graph (e).

At a subsequent instant $t_2$, logic circuit is LS switches the coders CC and CC' to activate threshold generators $R_2$, $D_2$ and $R_2'$, $D_2'$. As explained above, threshold generator $R_1'$, $D_1'$ remains active because of the preceding positive pulse $V_9$; on the other hand, threshold generator $R_1$, $D_1$ is deactivated. Thus, only the voltage $T_2$ is now superimposed by coder CC upon signal $V_1$ while the sum of voltages $T_1'$ and $T_2'$ is subtracted from that signal by coder CC'. As a result, as seen in graphs (a) and (d), voltage $V_4$ is still positive whereas voltage $V_5$ goes negative and is suppressed by comparator CS' as indicated by the dotted line in graph (e).

At the next instant $t_3$, logic circuit LS deactivates threshold generators $R_2$, $D_2$ and $R_2'$, $D_2'$ while activating the next-following generators; generator $R_1'$, $D_1'$ remains active as before. Voltage $V_4 = V_1 + T_3$ is still positive whereas voltage $V_5 = V_1 - (T_1' + T_3')$ happens to be zero in the example chosen. Leads 8 and 9, accordingly, remain de-energized as indicated in graphs (c) and (e).

Next, at an instant $t_4$, logic circuit LS substitutes the last threshold generators of the two coders for the ones recently activated, thus producing voltages $V_1 + T_4$ and $V_1 - (T_1' + T_4')$, both of which turn out to be positive. Voltage $V_9$, therefore, reappears as a positive pulse on lead 9 as shown in graph (e).

After deactivating all the active generators of coders CC and CC' at an instant $t_5$, logic circuit LS feeds the sign bit (detected from the absence of voltage $V_8$ as described above) via the adder A to the serializer SS, thereby completing the digitization of the sample $V_1$.

The following negative sample $V_1'$, appearing on line 1 at an instant $t_1'$, is shown to have a slightly smaller absolute magnitude than the preceding positive sample $V_1$. In the first coding cycle, logic circuit LS again activates the two threshold generators $R_1$, $D_1$ and $R_1'$, $D_1'$ whereby negative voltages $V_4 = -V_1' + T_1$ and $V_5 = -V_1' - T_1'$ respectively appear in the inputs of comparators CS and CS'. Voltage $V_4$, passed by comparator CS, gives rise to a negative pulse $V_7$ on lead 7 and a positive pulse $V_8$ on lead 8 as shown in graphs (b) and (c). Voltage $V_5$, however, is suppressed by comparator CS' so that lead 9 is de-energized as indicated in graph (e).

At the next instant $t_2'$, logic circuit LS activates threshold generators $R_2$, $D_2$ and $R_2'$, $D_2'$ while deactivating generator $R_1'$, $D_1'$ (generator $R_1$, $D_1$ remaining active). Voltage $V_4 = -V_1' + T_1 + T_2$ is now positive whereas voltage $V_5 = -V_1' - T_2'$ retains its negative polarity. Both these voltages are therefore suppressed so that neither lead 8 nor lead 9 is energized. The same situation continues in the third cycle starting at an instant $t_3'$, with $V_4 = -V_1' + T_1 + T_3$ and $V_5 = -V_1' - T_3'$, and in the fourth cycle starting at an instant $t_4'$, with $V_4 = -V_1' + T_1 + T_4$ and $V_5 = -V_1' - T_4'$. The coders are then deactivated at an instant $t_5'$ whereupon the sign bit, detected from the absence of voltage on lead 9, is fed to serializer SS.

Thus, as will be apparent from graphs (c) and (e), the absolute magnitudes of signal samples $V_1$ and $V_1'$ are converted into bit combinations 1-0-0-1 and 1-0-0-0, respectively.

We claim:

1. A method of converting samples of an amplitude-modulated analog signal into groups of binary pulses, comprising the steps of:
    (a) simultaneously subjecting each signal sample to a first series of n consecutive comparisons with a set of binarily weighted thresholds of one polarity and to a second series of n consecutive comparisons with a set of binarily weighted thresholds of the opposite polarity, thresholds differing in polarity from the sample being augmented by any previous threshold of the same series whose absolute magnitude is surpassed by that of the sample, thereby obtaining from either one of said series of comparisons an unbroken succession of n unipolar pulses and from the other series of comparisons a combination of both positive and negative pulses;
    (b) inverting the pulses obtained from said first series of comparisons;
    (c) suppressing the pulses of a predetermined polarity obtained from said first series of comparisons after inversion in step (b) and from said second series of comparisons in step (a), thereby transforming said combination of positive and negative pulses into a group of n amplitude bits representative of the absolute magnitude of said sample; and
    (d) generating a sign bit of logical value dependent upon the polarity of said unipolar pulses obtained in step (a).

2. A method as defined in claim 1, comprising the further step of placing the sign bit of step (d) ahead of said group of n amplitude bits formed in step (c).

3. A method as defined in claim 1 or 2 wherein said sample is successively compared in step (a) with n positive thresholds and n negative thresholds of progressively diminishing absolute value.

4. A system for converting samples of an amplitude-modulated signal wave into groups of binary pulses, comprising:
    first and second coding means connected in parallel to a source of signal samples, said first coding means including n binarily weighted threshold generators of one polarity, said second coding means including n threshold generators of the opposite polarity;
    logical control means for sequentially activating the corresponding threshold generators of both said coding means in the presence of a sample and simultaneously adding said sample algebraically to the output signals of the activated threshold generators thereof to obtain from either of said coding means an unbroken succession of n unipolar pulses and from the other of said coding means a combination of both positive and negative pulses, said control means maintaining the activation of any threshold generator of said other of said coding means whose threshold has an absolute magnitude surpassed by that of the sample;
    inverting first comparison means connected to said first coding means and noninverting second comparison means connected to said second coding means for suppressing pulses of a predetermined polarity in their outputs, thereby transforming said combination of positive and negative pulses into a group of n amplitude bits appearing in one of said outputs; and
    arithmetic circuitry connected to the outputs of said first and second comparison means for interleaving groups of n amplitude bits successively appearing therein and for supplementing each of said groups with a sign bit of logical value dependent upon the polarity of said n unipolar pulses.

5. A system as defined in claim 4 wherein said arithmetic circuitry includes bit-transposing means for placing said sign bit ahead of the corresponding group of n amplitude bits.

6. A system as defined in claim 4 or 5 wherein said logical circuitry has input connections to said first and second comparison means for selectively deactivating previously activated threshold generators according to the results of preceding algebraic additions.

* * * * *